(12) United States Patent
Grossman et al.

(10) Patent No.: US 7,244,467 B2
(45) Date of Patent: Jul. 17, 2007

(54) PROCESS FOR A BETA-PHASE NICKEL ALUMINIDE OVERLAY COATING

(75) Inventors: Theodore Robert Grossman, Hamilton, OH (US); Ramgopal Darolia, West Chester, OH (US); Joseph David Rigney, Milford, OH (US)

(73) Assignee: General Electric Company, Schenectady, NY (US)

( * ) Notice: Subject to any disclaimer, the term of this patent is extended or adjusted under 35 U.S.C. 154(b) by 653 days.

(21) Appl. No.: 10/604,368

(22) Filed: Jul. 15, 2003

(65) Prior Publication Data

US 2005/0011593 A1 Jan. 20, 2005

(51) Int. Cl.
*C23C 16/00* (2006.01)
(52) U.S. Cl. .................... 427/248.1; 427/355
(58) Field of Classification Search ............. 427/248.1, 427/456, 367, 383.1, 355; 428/633, 632, 428/610; 416/241 R; 72/47, 53; 420/34, 420/40; 148/542, 325
See application file for complete search history.

(56) References Cited

U.S. PATENT DOCUMENTS

| 3,754,898 A | * | 8/1973 | McGurty | 420/40 |
| 6,340,500 B1 | | 1/2002 | Spitsberg | 427/250 |
| 6,475,310 B1 | * | 11/2002 | Dunning et al. | 148/605 |

FOREIGN PATENT DOCUMENTS

GB 2 375 725 A 11/2002

OTHER PUBLICATIONS

"The effect of grit blasting on the oxidation behavior of a platinum-modified nickel-aluminide coating"; Metallurgical and Materials Transactions a (Physical Metallurgy and Materials Science) Minerals, Metals & Mater. Soc. & ASM INT USA, vol. 32A, No. 6, Jun. 1, 2001, pp. 1467-1478, XP008036870; ISSN: 1073-5623.

* cited by examiner

*Primary Examiner*—Timothy Meeks
*Assistant Examiner*—Elizabeth Burkhart
(74) *Attorney, Agent, or Firm*—David L. Narciso; Gary M. Hartman; Domenica N. S. Hartman

(57) ABSTRACT

A process for forming a beta-phase nickel aluminide (NiAl) overlay coating that is suitable for use as a bond coat for a thermal barrier coating (TBC). The overlay coating is deposited by a method that produces a generally columnar grain structure in which grains extend through the coating such that at least some grain boundaries are open at the coating surface. The coating is then peened with a particulate media, followed by heating the overlay coating to a temperature sufficient to cause the overlay coating to recrystallize and form new grain boundaries that are not open to the outer surface of the coating and significantly less susceptible to accelerated oxidation than the original grain boundaries. The particulate media is formed of a composition containing nickel and aluminum, such that an oxide scale that forms on the surface of the coating after the peening operation is substantially free of deleterious oxide compounds, notably iron-containing spinels.

20 Claims, 1 Drawing Sheet

PROCESS FOR A BETA-PHASE NICKEL ALUMINIDE OVERLAY COATING

BACKGROUND OF INVENTION

1. Field of the Invention

This invention relates to protective coating systems for components exposed to high temperatures, such as the hostile thermal environment of a gas turbine engine. More particularly, this invention is directed to a beta-phase nickel aluminide overlay coating and to a process for modifying the grain structure of the coating to improve its oxidation resistance and promote the formation of a protective oxide scale on the coating that is substantially free of spinels.

2. Description of the Related Art

Components of the turbine, combustor and augmentor sections of gas turbine engines are often protected by a metallic environmental coating and/or a thermal barrier coating (TBC), the latter of which is typically a ceramic material bonded to the component surface with a metallic bond coat. Coating materials that have been widely employed as environmental coatings and bond coats include diffusion aluminide coatings and MCrAlX overlay coatings (where M is iron, cobalt and/or nickel, and X is yttrium or another rare earth element). The aluminum content of these materials provides for the slow growth of a strong adherent and continuous aluminum oxide layer (alumina scale) at elevated temperatures, which protects the coating and its underlying substrate from oxidation and hot corrosion. When the coating serves as a bond coat for a TBC, the alumina scale also chemically bonds the ceramic topcoat to the bond coat.

Other types of environmental coatings and bond coats that have been proposed include beta-phase nickel aluminide (NiAl) overlay coatings. In contrast to the aforementioned MCrAlX overlay coatings, which are metallic solid solutions containing intermetallic phases, the NiAl beta phase is an intermetallic compound that exists for nickel-aluminum compositions containing about 30 to about 60 atomic percent aluminum. Notable examples of beta-phase NiAl coating materials are disclosed in commonly-assigned U.S. Pat. No. 5,975,852 to Nagaraj et al., U.S. Pat. No. 6,291,084 to Darolia et al., U.S. Pat. No. 6,153,313 to Rigney et al., and U.S. Pat. No. 6,255,001 to Darolia. These NiAl compositions, which preferably contain a reactive element (such as zirconium and/or hafnium) and/or other alloying constituents (such as chromium), have been shown to improve the adhesion of a ceramic TBC, thereby increasing the spallation resistance of the TBC.

In addition to modifying the chemistry of NiAl-base environmental coatings and bond coats, investigations have been undertaken to determine the effect that the surface finish of beta-phase NiAl overlay coatings has on their oxidation resistance and their ability to adhere a ceramic coating. Commonly-assigned U.S. Pat. No. 7,150,922 to Spitsberg et al. discloses a process by which the grain structure of a beta-phase NiAl overlay bond coat can be modified to improve the spallation resistance of a ceramic TBC deposited on the bond coat. The NiAl overlay coating is deposited by methods that produce a generally columnar grain structure, e.g., physical vapor deposition (PVD) techniques, with the result that open grain boundaries are typically present at the coating surface, with the grains physically separated thereby being referred to as leaders. For NiAl coatings of the type taught by the aforementioned U.S. Pat. Nos. 6,153,313, 6,255,001 and 6,291,084, leaders are characterized by both a physical separation and chemical differences, and has been associated with reduced oxidation and spallation resistance as a result of providing a pathway for oxidation. To reduce the presence of deleterious leaders, Spitsberg et al. recrystallize the NiAl coating during or after deposition, resulting in the formation of new surface grain boundaries. Recrystallization is achieved by depositing the coating on a substrate maintained at a sufficiently high temperature so that recrystallization occurs during deposition, or by cold or warm working the coating surface and then heat treating the coating at a temperature sufficient to cause recrystallization.

A particular technique disclosed by Spitsberg et al. for cold or warm working the coating surface is shot peening. In practice, stainless steel shot peening media has been used. However, NiAl overlay coatings peened in this manner have been found to form an iron-containing spinel scale that can promote the spallation of a ceramic coating deposited on the coatings.

SUMMARY OF INVENTION

The present invention generally provides a process for forming an overlay coating that is suitable for use as a bond coat for a thermal barrier coating (TBC), a particular example of which are overlay coatings formed of beta-phase NiAl intermetallic. The invention further provides a method of modifying the grain structure of an overlay coating in order to improve the oxidation resistance of the coating and the spallation resistance of any TBC deposited on the overlay coating. Overlay coatings of this invention are deposited by methods that produce a generally columnar grain structure in which grains, and therefore grain boundaries, extend through the bond coat, from the outer surface of the bond coat to the surface of the substrate on which the bond coat is deposited. Furthermore, some of these grain boundaries are open at the bond coat surface.

According to a first aspect of the invention, the oxidation resistance of an overlay coating of a type described above and the spallation resistance of a TBC deposited on the overlay coating can be improved by modifying the microstructure of the overlay coating. The overlay coating is first deposited on a substrate surface to have as-deposited grains that define as-deposited grain boundaries exposed at the outer surface of the overlay coating, at least some of which are open to the outer surface of the overlay coating. The overlay coating is then peened with a particulate media formed of a composition containing nickel and aluminum, followed by heating the overlay coating to a temperature sufficient to cause the overlay coating to recrystallize and form new grain boundaries that, though exposed at the outer surface of the overlay coating, are not open to the outer surface. In accordance with the aforementioned U.S. Pat. No. 7,150,922 to Spitsberg et al., the new grain boundaries exposed at the surface of the recrystallized overlay coating are significantly less susceptible to accelerated oxidation than are the original grain boundaries of the as-deposited overlay coating, such that the oxidation resistance of the overlay coating is improved.

According to a preferred aspect of the invention, when the overlay coating is subjected to an elevated temperature, an oxide scale forms on the surface of the overlay coating that is substantially free of deleterious spinel, particularly iron-containing spinel. For this reason, the composition used to form the peening media preferably contains nickel and aluminum, but is essentially free of elements (e.g., iron) that could contaminate the overlay coating and thereafter form a non-protective spinel scale (e.g., spinel containing $Fe_2O_3$, $Fe_3O_4$) on the overlay coating surface during a subsequent high temperature excursion. If the overlay coating is intended as a bond coat for a ceramic coating, the oxide scale that forms between the overlay coating and the ceramic coating at elevated temperatures is also substantially free of spinel. In the absence of any significant amount of spinel scale, the spallation resistance of the ceramic coating is significantly improved.

Other objects and advantages of this invention will be better appreciated from the following detailed description.

DETAILED DESCRIPTION

Figure 1:
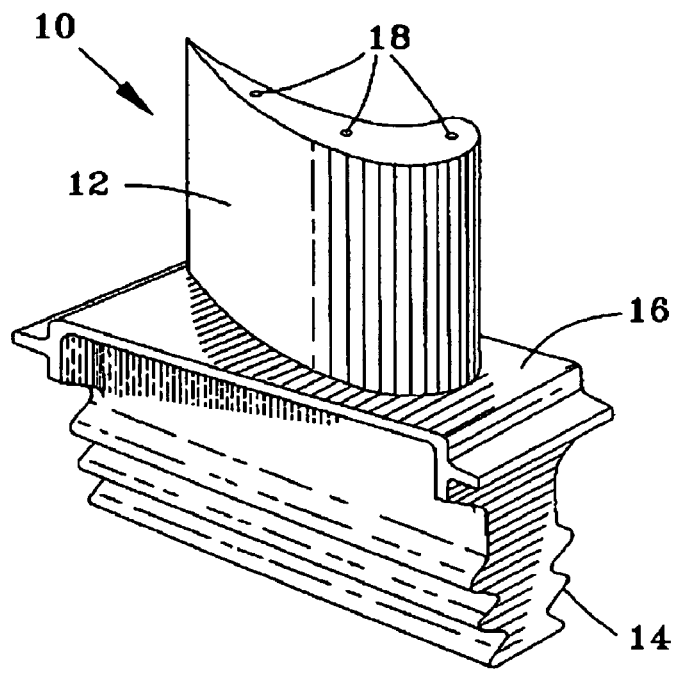
FIG. 1 is a perspective view of a high pressure turbine blade.

The present invention is generally applicable to components that operate within environments characterized by relatively high temperatures, and are therefore subjected to severe thermal stresses and thermal cycling. Notable examples of such components include the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to severe attack by oxidation, corrosion and erosion. The airfoil 12 is anchored to a turbine disk (not shown) with a dovetail 14 formed on a root section 16 of the blade 10. Cooling holes 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which an environmental coating or TBC system may be used to protect the component from its environment.

Figure 2:
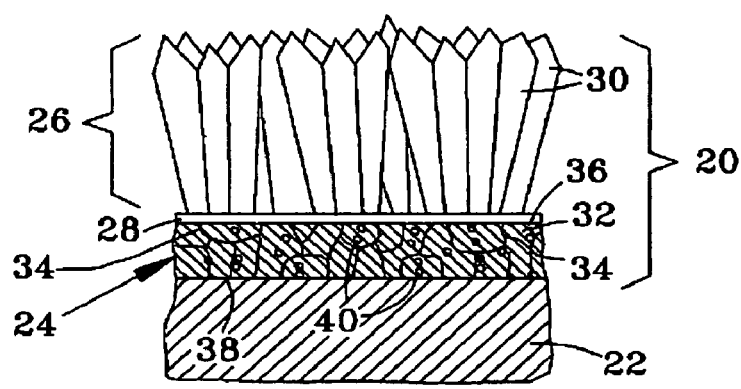
FIG. 2 is a cross-sectional representation of a TBC system on a surface region of the blade of FIG. 1, and represents the condition of a beta-phase NiAl overlay bond coat that has been processed in accordance with this invention.

Represented in FIG. 2 is a thermal barrier coating (TBC) system 20 that includes an overlay bond coat 24 and a thermal-insulating ceramic layer 26, or TBC, on a superalloy substrate 22 that is typically the base material of the blade 10 in FIG. 1. Suitable materials for the substrate 22 (and therefore the blade 10) include equiaxed, directionally-solidified and single-crystal nickel and cobalt-base superalloys. The bond coat 24 adheres the ceramic layer 26 to the substrate 22 through the growth of an oxide scale 28 when the bond coat 24 is exposed to an oxidizing atmosphere, such as during high temperature exposures in air and during deposition of the ceramic layer 26. As shown, the ceramic layer 26 has a strain-tolerant grain structure of columnar grains 30 achieved by depositing the ceramic layer 26 using physical vapor deposition (PVD) techniques known in the art, such as electron beam physical vapor deposition (EB-PVD). A preferred material for the ceramic layer 26 is an yttria-stabilized zirconia (YSZ), a preferred composition being about 4 to about 8 weight percent yttria, though other ceramic materials could be used, such as yttria, nonstabilized zirconia, or zirconia stabilized by magnesia, ceria, scandia or other oxides. The ceramic layer 26 is deposited to a thickness that is sufficient to provide the required thermal protection for the underlying substrate 22 and blade 10, generally on the order of about 75 to about 300 micrometers.

As an overlay coating, little interdiffusion occurs between the bond coat 24 and the substrate 22 during deposition as well as any subsequent heat treatments or thermal excursions. According to a preferred aspect of the invention, the bond coat 24 is formulated in accordance with any one of commonly-assigned U.S. Pat. No. 6,153,313 to Rigney et al., U.S. Pat. No. 6,255,001 to Darolia, and U.S. Pat. No. 6,291,084 to Darolia et al., and is therefore a beta-phase NiAl intermetallic that may contain one or more additional alloying constituents (NiAl(X), where X is zirconium, hafnium, chromium and/or another element disclosed in the aforementioned patents). For example, the bond coat 24 may contain, in atomic percent, about 30% to about 60% aluminum, about 0.1% to about 1.2% zirconium, optionally up to about 15% chromium, and the balance essentially nickel. A thickness of about 50 micrometers is suitable for the beta-phase NiAl bond coat 24 to protect the underlying substrate 22 and provide an adequate supply of aluminum to form the oxide scale 28 (i.e., an alumina scale), though thicknesses of about 10 to about 125 micrometers are believed to be acceptable. While overlay coatings formed of beta-phase NiAl intermetallic are preferred and discussed below in reference to this invention, the teachings of this invention are also believed to be applicable to overlay coatings formed of other materials capable of providing environmental protection in hostile environments, such as MCrAlX.

Figure 3:
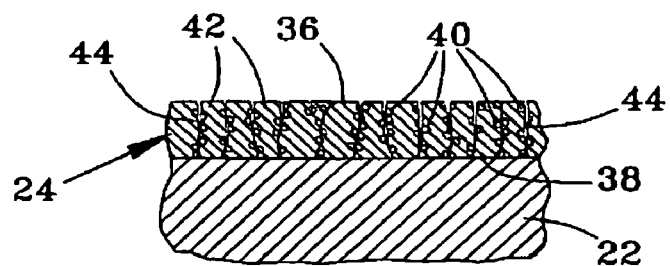
FIG. 3 is a cross-sectional representation of an NiAl overlay bond coat of the TBC system shown in FIG. 2, but in the as-deposited condition.

The bond coat 24 is represented in FIG. 2 as having been deposited and processed in accordance with this invention so that grain boundaries 34 that intersect the surface 36 of the bond coat 24 are substantially closed (adjacent grains 32 are not physically separated by spaces), and any precipitates 40 within the bond coat 24 are located primarily within the grains 32 of the bond coat 24, and largely absent from the grain boundaries 34. In contrast, FIG. 3 represents the overlay bond coat 24 as it would appear if deposited and processed in accordance with conventional practice, e.g., in an as-deposited condition without any additional treatment. The type of microstructure represented in FIG. 3 may be observed in NiAl overlay coatings deposited by PVD, including EBPVD, sputtering and directed vapor deposition (DVD). In FIG. 3, the bond coat 24 is characterized by grains 42 that extend through the bond coat 24, from the surface 36 of the bond coat 24 to the surface 38 of the substrate 22, such that the grains 42 are generally columnar with a larger aspect ratio than the grains 32 depicted in FIG. 2. As also represented in FIG. 3, the grains 42 have grain boundaries 44 that intersect the surface 36 of the bond coat 24. The grain boundaries 44, many of which are open to the bond coat surface 36 to define grains 42 that may be termed leaders, are shown as being decorated with precipitates 40 formed during deposition of the bond coat 24 as would result from the presence of zirconium, hafnium, or certain other alloying constituents within the NiAl material. p As discussed in the U.S. Pat. No. 7,150,922 to Spitsberg et al., the microstructure depicted in FIG. 2 is more resistant to oxidation than the microstructure depicted in FIG. 3, with the result that a TBC (the ceramic layer 26 in FIG. 2) deposited on the bond coat 24 is more resistant to spallation. According to Spitsberg et al., oxidation occurs via the grain boundaries 44 along the grains 42, allowing for accelerated oxidation through the coating thickness. On this basis, improved oxidation resistance of an NiAl overlay bond coat, and therefore the spallation resistance of a TBC deposited on the bond coat, can be achieved by eliminating grain boundaries 44 that are open to the coating surface 36 and contain precipitates 40, particularly Zr-rich precipitates. In accordance with the teachings of Spitsberg et al., an equiaxed NiAl overlay bond coat of the type represented in FIG. 2 can be achieved through bulk recrystallization of the bond coat during or following coating deposition, resulting in the elimination or "healing" of the leader grain boundaries 44 represented in FIG. 3. For example, high deposition (substrate) temperatures on the order of about 1200° C. and greater have been shown to cause bulk recrystallization during deposition with fewer open grain boundaries, yielding a bond coat similar to the bond coat 24 of FIG. 2. Alternatively, improvements in oxidation resistance of a NiAl overlay coating can be achieved with coatings deposited at lower substrate temperatures, but then caused to recrystallize by appropriate post-deposition processing. For example, recrystallization can be induced by a surface mechanical treatment (e.g., peening) that introduces cold working into the bond coat, so that at least the surface if not the entire overlay coating undergoes recrystallization when sufficiently heated to drive the recrystallization process. In each case, improved oxidation and spallation resistance are attributed at least in part to the fewer number of precipitates (particularly Zr-rich precipitates in a Zr-containing NiAl coating) that decorate the grain boundaries of the recrystallized bond coat (FIG. 2) as compared to the original columnar grain boundaries of the as-deposited NiAl bond coat (FIG. 3).

In an investigation leading to this invention, it was observed that NiAl bond coats processed by the postdeposition peening technique described above may exhibit less than desired oxidation and spallation resistance. On examination of such specimens, it was further observed that the oxide scale (28 in FIG. 2) contained spinels, particularly iron-containing spinels, rather than alpha-alumina scale that is known to promote adhesion of a ceramic coating. As is generally conventional, the peening operation had been performed with stainless steel shot as the peening media. It was theorized that the stainless steel shot may have contaminated the NiAl bond coats with small amounts of iron, which then diffused into the surfaces of the bond coats during subsequent processing, including the post-peening heat treatment. As a result, following TBC deposition and subjecting the coating system to an elevated temperature, the oxide scale that grew on the surfaces of the bond coats became contaminated with iron from the peening media, leading to the formation of a scale comprising iron-containing spinel-type oxides (e.g., $Fe_2O_3$, $Fe_3O_4$) that are not adherent to the bond coats.

Based on the above, the present invention makes use of peening media whose composition is selected to be chemically compatible with the bond coat material and essentially free of deleterious spinel-forming elements, i.e., elements whose oxides, in contrast to slow-growing protective alumina ($Al_2O_3$), is not protective in that they allow for relatively rapid diffusion of oxygen. An example of a deleterious spinel-forming element of particular concern with this invention is iron. In view of the above requirements, media compositions containing nickel and aluminum are well suited for peening overlay coatings containing nickel and aluminum, such as the beta-phase NiAl(X) overlay coatings (where X is zirconium, hafnium, chromium and/or another element) disclosed in the aforementioned patents to Rigney et al., Darolia, and Darolia et al. Particularly suitable compositions for the peening media include beta-phase NiAlCrZr intermetallic and NiCrAlY, the latter of which is an MCrAlX composition used in the past to form environmental coatings and bond coats for TBC systems. The compositions of NiCrAlY powders used to form plasma-sprayed environmental coatings and TBC bond coats are controlled and sufficiently similar in chemistry to avoid contamination of an overlay coating 24 formed of beta-phase NiAlCrZr. NiCrAlY powder particles are also of sufficient strength and fracture toughness to apply the required compressive stresses to the coating 24 without disintegrating on impact. Powders of the beta-phase NiAl (X) compositions used to form the coating 24 of this invention are harder than NiCrAlY, and for this reason may be preferred media for the peening operation. NiAl—CrZr can be manufactured using processes similar to those used to produce MCrAlY (e.g., NiCrAlY) powders for plasma spraying deposition. Furthermore, the composition of a NiAl(X) powder can be modified for the shot peening operation. For example, the amount of aluminum can be varied and chromium, zirconium, etc., can be added in controlled amounts to tailor the chemistry of the media for the particular composition of the coating 24, as well as to increase the hardness of the media.

Because recrystallization is expected to be dependent on peening intensity, a sufficient peening intensity is believed to be critical to achieving improved oxidation resistance by way of recrystallization. For this reason, the peening media must be in the form of particles of a size to achieve sufficiently intense peening, preferably at least about 400 in diameter, such as on the order of about 600 micrometers in diameter. The shot peening process itself should preferably achieve full surface coverage and an intensity of at least 4A. Following peening, the coating is heat treated at a temperature of at least about 900° C., such as about 980° C. to about 1100° C. for a duration of about 0.5 to about 4 hours in an inert or otherwise low-oxygen atmosphere (e.g., a vacuum on the order of about $10^{-3}$ to $10^{-5}$ Torr (about $1.3 \times 10^{-3}$ to about $1.3 \times 10^{-5}$ mbar), to drive the recrystallization process.

According to one aspect of the invention, the peening media can be obtained as a by-product of processes used to form NiCrAlY powders that are plasma sprayed to form environmental coatings and bond coats for TBC. Under manufacturing conditions for powders intended to be plasma sprayed, the particle size distributions are controlled to produce particles of a relative fine size for plasma spraying, e.g., typically on the order of about −270 mesh (+25 micrometers). A coarser fraction is inevitably produced and eliminated in a waste stream. The process of the present invention is able to make use of at least a portion of this coarse fraction in the peening operation.

While the invention has been described in terms of a preferred embodiment, it is apparent that other forms could be adopted by one skilled in the art. Therefore, the scope of the invention is to be limited only by the following claims.

The invention claimed is:

1. A process for improving the oxidation resistance of an overlay coating, the process comprising the steps of:
   depositing the overlay coating on a surface of a substrate, the overlay coating being deposited so as to be characterized by as-deposited grains that define as-deposited grain boundaries that intersect the outer surface of the overlay coating, at least some of the as-deposited grain boundaries being open at the outer surface of the overlay coating;
   peening the overlay coating with a particulate media formed of a composition containing nickel and aluminum but substantially free of iron; and then heating the overlay coating to a temperature sufficient to cause the overlay coating to recrystallize and form new grain boundaries that are not open to the outer surface of the overlay coating.

2. The process according to claim 1, wherein the heating step comprises heating the overlay coating to a temperature of at least 900° C.

3. The process according to claim 1, wherein the overlay coating is primarily beta-phase nickel aluminide intermetallic.

4. The process according to claim 1, wherein the as-deposited grain boundaries contain more precipitates than the new grain boundaries.

5. The process according to claim 1, wherein the overlay coating contains at least one of zirconium and hafnium.

6. The process according to claim 5, wherein the composition of the particulate media is an intermetallic and contains at least one of zirconium and hafnium.

7. The process according to claim 1, wherein the composition of the particulate media comprises a metallic solid solution and contains yttrium.

8. The process according to claim 1, further comprising the step of depositing a ceramic coating on the overlay coating to form a thermal barrier coating system.

9. A process for improving the oxidation resistance of an overlay coating, the process comprising the steps of:
depositing the overlay coating on a surface of a substrate, the overlay coating being deposited so as to be characterized by as-deposited grains that define as-deposited grain boundaries that intersect the outer surface of the overlay coating, at least some of the as-deposited grain boundaries being open at the outer surface of the overlay coating;
peening the overlay coating with a particulate media formed of a composition containing nickel and aluminum, wherein the composition of the particulate media comprises a metallic solid solution and contains yttrium; and then
heating the overlay coating to a temperature sufficient to cause the overlay coating to recrystallize and form new grain boundaries that are not open to the outer surface of the overlay coating.

10. The process according to claim 9, further comprising the steps of producing the particulate media to have relative finer and coarser particles, using the coarser particles in the peening step, and plasma spraying the finer particles on a second substrate to form a NiCrAlY coating on the second substrate.

11. A process for improving the oxidation resistance of an overlay coating, the process comprising the steps of:
depositing the overlay coating on a surface of a substrate, the overlay coating being deposited so as to be characterized by as-deposited grains that define as-deposited grain boundaries that intersect the outer surface of the overlay coating, at least some of the as-deposited grain boundaries being open at the outer surface of the overlay coating;
peening the overlay coating with a particulate media formed of a composition containing nickel and aluminum and substantially free of iron;
heating the overlay coating to a temperature sufficient to cause the overlay coating to recrystallize and form new grain boundaries that are not open to the outer surface of the overlay coating,
depositing a ceramic coating on the overlay coating to form a thermal barrier coating system, and then
subjecting the thermal barrier coating system to an elevated temperature to form an oxide scale between the overlay coating and the ceramic coating, the oxide scale being substantially free of spinel.

12. A process for improving the oxidation resistance of a beta-phase nickel aluminide overlay coating and improving the spallation resistance of a ceramic coating deposited on the overlay coating, the process comprising the steps of:
depositing the overlay coating on a surface of a superalloy component by a physical vapor deposition technique, the overlay coating having as-deposited grains defining as-deposited grain boundaries that are continuous through the overlay coating from an outer surface of the overlay coating to the surface of the component, at least some of the as-deposited grain boundaries containing precipitates and being open at the outer surface of the overlay coating;
peening the overlay coating with a particulate media formed of a composition that contains nickel, aluminum and chromium and is essentially free of iron;
heat treating the overlay coating to a temperature sufficient to cause the overlay coating to recrystallize and form new grain boundaries that are not open to the outer surface of the overlay coating and contain fewer precipitates than the as-deposited grain boundaries;
depositing a ceramic coating on the overlay coating to form a thermal barrier coating system; and
subjecting the thermal barrier coating system to an elevated temperature to form an oxide scale between the overlay coating and the ceramic coating, the oxide scale being substantially free of spinel.

13. The process according to claim 12, wherein the heating step comprises heating the overlay coating to a temperature of at least 900° C. in a low-oxygen atmosphere.

14. The process according to claim 12, wherein the overlay coating contains at least one of zirconium and hafnium.

15. The process according to claim 14, wherein the overlay coating further contains chromium.

16. The process according to claim 14, wherein the precipitates present in the as-deposited grain boundaries contain at least one of zirconium and hafnium, and the precipitates are substantially absent from the new grain boundaries.

17. The process according to claim 14, wherein the composition of the particulate media is an intermetallic consisting essentially of nickel, chromium, aluminum, zirconium, and intermetallics thereof.

18. The process according to claim 12, wherein the composition of the particulate media consists essentially of nickel, chromium, aluminum, yttrium and comprises a metallic solid solution and at least one intermetallic phase.

19. The process according to claim 12, further comprising the steps of producing the particulate media using a process that yields relative finer and relatively coarser particles, using the coarser particles in the peening step, and plasma spraying the finer particles on a surface of a second component to form a NiCrAlY coating on the second component.

20. The process according to claim 19, wherein the coarser particles have a particle size of at least about 400 micrometers.

* * * * *